· US009136365B2

(12) United States Patent
Lee et al.

(10) Patent No.: US 9,136,365 B2
(45) Date of Patent: Sep. 15, 2015

(54) POWER DEVICES AND METHOD FOR MANUFACTURING THE SAME

(71) Applicant: Samsung Electronics Co., Ltd., Suwon-si, Gyeonggi-do (KR)

(72) Inventors: Jae Hoon Lee, Suwon-si (KR); Ki Se Kim, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 28 days.

(21) Appl. No.: 13/716,640

(22) Filed: Dec. 17, 2012

(65) Prior Publication Data

US 2013/0168698 A1    Jul. 4, 2013

(30) Foreign Application Priority Data

Dec. 28, 2011    (KR) .................. 10-2011-0144859

(51) Int. Cl.
| | |
|---|---|
| H01L 29/16 | (2006.01) |
| H01L 21/02 | (2006.01) |
| H01L 29/78 | (2006.01) |
| H01L 29/66 | (2006.01) |
| H01L 29/267 | (2006.01) |
| H01L 29/872 | (2006.01) |
| H01L 29/06 | (2006.01) |
| H01L 29/45 | (2006.01) |
| H01L 29/47 | (2006.01) |
| H01L 29/20 | (2006.01) |

(52) U.S. Cl.
CPC ............ *H01L 29/78* (2013.01); *H01L 29/0619* (2013.01); *H01L 29/267* (2013.01); *H01L 29/6606* (2013.01); *H01L 29/66068* (2013.01); *H01L 29/66477* (2013.01); *H01L 29/872* (2013.01); *H01L 29/1608* (2013.01); *H01L 29/2003* (2013.01); *H01L 29/45* (2013.01); *H01L 29/47* (2013.01)

(58) Field of Classification Search
CPC ... H01L 29/78; H01L 29/0619; H01L 29/872; H01L 29/66477; H01L 29/267; H01L 29/66068; H01L 29/1608; H01L 29/6606; H01L 29/45; H01L 29/47; H01L 29/2003; H01L 21/02378; H01L 29/66075; H01L 29/66053
USPC .................. 257/155, 183, 189, 190, 192, 77, 257/E29.178
See application file for complete search history.

(56) References Cited

U.S. PATENT DOCUMENTS

| | | | |
|---|---|---|---|
| 7,592,647 B2 * | 9/2009 | Nakata et al. ................ 257/194 |
| 7,745,851 B2 * | 6/2010 | Harris ............................ 257/194 |
| 2001/0013604 A1 * | 8/2001 | Hase ................................ 257/12 |

(Continued)

FOREIGN PATENT DOCUMENTS

| | | |
|---|---|---|
| JP | 2001-119025 | 4/2001 |
| JP | 2005-175357 | 6/2005 |

(Continued)

*Primary Examiner* — Latanya N Crawford
(74) *Attorney, Agent, or Firm* — Lee & Morse, P.C.

(57) ABSTRACT

A power device includes a substrate, a silicon carbide ($Si_xC_{1-x}$) layer on one surface of the substrate, wherein $0<x<1$, and a re-grown gallium nitride (GaN) layer formed by etching a part of the $Si_xC_{1-x}$ layer and growing GaN from an etched area of the $Si_xC_{1-x}$ layer.

18 Claims, 6 Drawing Sheets

(56) References Cited

U.S. PATENT DOCUMENTS

| | | | |
|---|---|---|---|
| 2003/0098462 A1* | 5/2003 | Yoshida | 257/183 |
| 2004/0124435 A1* | 7/2004 | D'Evelyn et al. | 257/103 |
| 2006/0220060 A1* | 10/2006 | Nakata et al. | 257/189 |
| 2008/0006829 A1* | 1/2008 | Wuu et al. | 257/76 |
| 2008/0079009 A1* | 4/2008 | Yaegashi | 257/77 |
| 2009/0072243 A1* | 3/2009 | Suda et al. | 257/77 |
| 2010/0072485 A1* | 3/2010 | Suda et al. | 257/77 |
| 2011/0101374 A1* | 5/2011 | Ryu et al. | 257/77 |
| 2012/0302178 A1* | 11/2012 | Beam, III | 455/73 |
| 2013/0034939 A1* | 2/2013 | Lee et al. | 438/197 |
| 2013/0316502 A1* | 11/2013 | Mishra et al. | 438/172 |
| 2014/0077311 A1* | 3/2014 | Simin et al. | 257/401 |
| 2014/0110722 A1* | 4/2014 | Kub et al. | 257/77 |
| 2014/0159051 A1* | 6/2014 | Kizilyalli et al. | 257/76 |

FOREIGN PATENT DOCUMENTS

| | | |
|---|---|---|
| JP | 2007-103585 | 4/2007 |
| JP | 2007-294716 | 11/2007 |

* cited by examiner

POWER DEVICES AND METHOD FOR MANUFACTURING THE SAME

CROSS-REFERENCE TO RELATED APPLICATION

This application claims the benefit under 35 U.S.C. §119 of Korean Patent Application No. 10-2011-0144059, filed on Dec. 28, 2011, in the Korean Intellectual Property Office, the disclosure of which is incorporated herein by reference.

BACKGROUND

1. Field

Embodiments relate to a power device and a manufacturing method for the power device.

2. Description of the Related Art

A semiconductor light emitting diode (LED) is a semiconductor device that generates various colors of light upon application of a current through recombination of electrons and holes at a p-n junction between p-type and n-type semiconductors. In comparison to a filament-based LED, the semiconductor LED may have a longer life, lower power consumption, excellent initial driving characteristics, and higher vibration resistance. Thus, there has been a continuous increase in demand for semiconductor LEDs. For example, a nitride semiconductor capable of emitting a short-wavelength blue light has been drawing attention.

Recently, with a rapid development of information and communication technology throughout the world, communication technology for large-capacity signal transmission has been developing rapidly. Particularly, in the field of wireless communication technology, as demand has increased for personal mobile phones, satellite communication, military radar, broadcasting communication, and communication relays, and the like, demand has also increased for a high-speed high-power electronic device for an ultrahigh-speed information communication system using a microwave and millimeter wave bandwidth. In addition, research has been under way for applications related to high-power devices and reductions in energy loss.

SUMMARY

Embodiments are directed to a power device including a substrate, a silicon carbide ($Si_xC_{1-x}$) layer on one surface of the substrate, and a re-grown gallium nitride (GaN) layer formed by etching a part of the $Si_xC_{1-x}$ layer and growing GaN from an etched area of the $Si_xC_{1-x}$ layer. The value x of the $Si_xC_{1-x}$ layer may be within a range of 0<x<1.

The substrate may be an n-type SiC substrate, and the re-grown GaN layer may be a p-GaN layer doped with p-type impurities. The power device may be a Schottky barrier diode (SBD) and may further include a first electrode on the $Si_xC_{1-x}$ layer, and a second electrode on another surface of the substrate, opposite to the surface on which the $Si_xC_{1-x}$ layer is located. The $Si_xC_{1-x}$ layer may be an n-type $Si_xC_{1-x}$ layer doped with n-type impurities. The first electrode may include a material selected from nickel (Ni), gold (Au), copper indium oxide ($CuInO_2$), indium tin oxide (ITO), platinum (Pt), and alloys thereof. The second electrode may include a material selected from chromium (Cr), aluminum (Al), tantalum (Ta), thallium (Tl), and Au. A doping concentration of the p-type impurities of the p-GaN layer may be about $1.0\times10^{16}/cm^3$ to about $1.0\times10^{20}/cm^3$.

The substrate may be a p-type SiC layer, and the re-grown GaN layer may be an n-GaN layer doped with n-type impurities. The power device may be a field effect transistor (FET) and may further include a gate electrode on the $Si_xC_{1-x}$ layer and a source electrode and a drain electrode disposed on the n-GaN layer. The $Si_xC_{1-x}$ layer may be a p-type $Si_xC_{1-x}$ layer doped with p-type impurities. The source electrode and the drain electrode may include a material selected from Ni, Au, $CuInO_2$, ITO, Pt, and alloys thereof. The source electrode and the drain electrode include a material selected from an alloy of Ni and Au, an alloy of $CuInO_2$ and Au, an alloy of ITO and Au, an alloy of Ni, Pt, and Au, and an alloy of Pt and Au. A doping concentration of the n-type impurities of the n-GaN layer may be about $1.0\times10^{16}/cm^3$ to about $1.0\times10^{20}/cm^3$.

Embodiments are also directed to a manufacturing method for a power device, the method including forming a $Si_xC_{1-x}$ layer on one surface of a substrate, etching a part of the $Si_xC_{1-x}$ layer, and growing GaN from an etched area of the $Si_xC_{1-x}$ layer to form a re-grown GaN layer.

The growing of GaN from the etched area of the $Si_xC_{1-x}$ layer to form the re-grown GaN layer may be performed within a temperature range of about 1000° C. to about 1200° C.

The substrate may be an n-type SiC substrate, and the re-grown GaN layer may be a p-GaN layer doped with p-type impurities. The manufacturing method may further include forming a first electrode on the re-grown GaN layer and the $Si_xC_{1-x}$ layer such that the first electrode is in contact with the re-grown GaN layer, and forming a second electrode on another surface of the substrate, opposite to the one surface on which the $Si_xC_{1-x}$ layer is disposed. The $Si_xC_{1-x}$ layer may be an n-type $Si_xC_{1-x}$ layer doped with n-type impurities.

The substrate may be a p-type SiC substrate, and the re-grown GaN layer may be an n-GaN layer doped with n-type impurities. The manufacturing method may further include forming a gate electrode on the $Si_xC_{1-x}$ layer, and forming a source electrode and a drain electrode on the n-GaN layer. The $Si_xC_{1-x}$ layer may be a p-type $Si_xC_{1-x}$ layer doped with p-type impurities.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
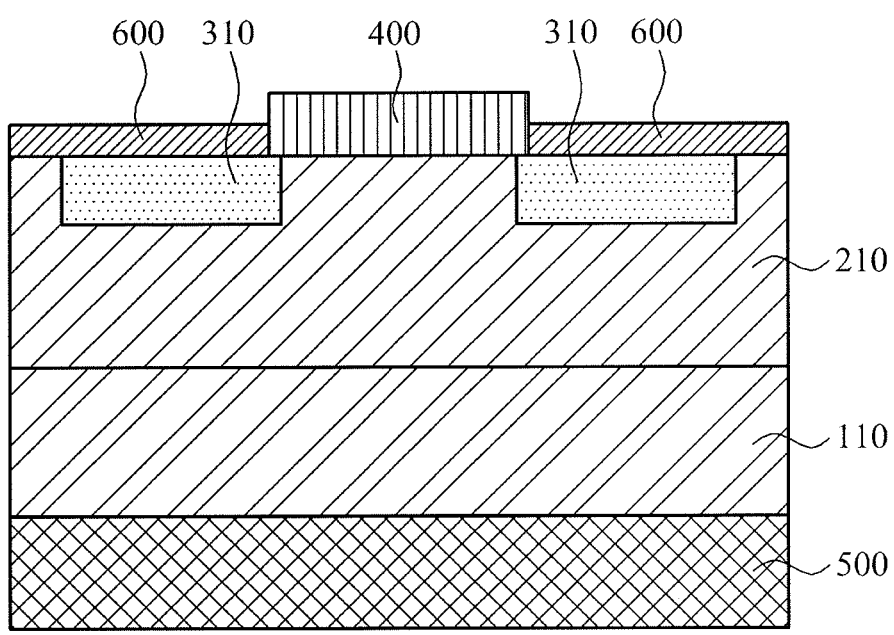
FIG. 1 illustrates a diagram depicting a power device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
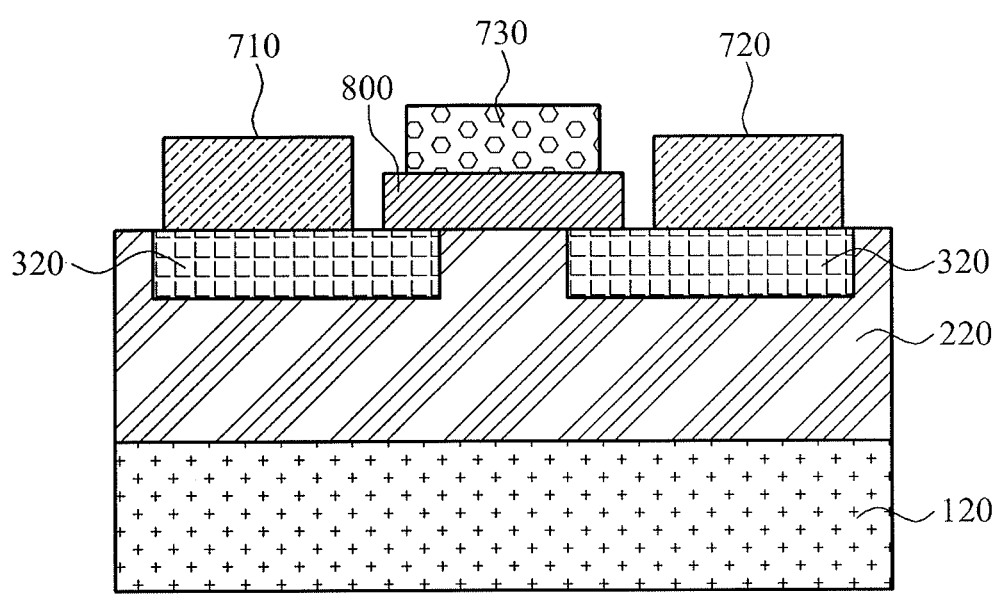
FIG. 2 illustrates a diagram depicting a power device according to another embodiment.

FIG. 1 illustrates a case in which a power device according to an embodiment is a Schottky barrier diode (SBD). FIG. 2 illustrates a case in which a power device according to another embodiment is a field effect transistor (FET) provided in a metal oxide semiconductor (MOS) structure, that is, a MOS-FET.

The power devices, of FIG. 1 and FIG. 2, may include substrates 110 and 120, silicon carbide ($Si_xC_{1-x}$) layers 210 and 220, and re-grown gallium-nitride (GaN) layers 310 and 320, respectively.

With reference to FIG. 1, when the power device is an SBD, the substrate 110 may be an n-type SiC substrate doped with n-type impurities.

The $Si_xC_{1-x}$ layer 210 may be disposed on one surface of the substrate 110. In the $Si_xC_{1-x}$ layer 210, silicon (Si) and carbon (C) may be mixed at a predetermined ratio and the predetermined ratio may be adjusted as desired. The $Si_xC_{1-x}$ layer 210 may facilitate a flow of current. A value x of the $Si_xC_{1-x}$ layer 210 may be within a range of 0<x<1. According to an exemplary embodiment, the value x may be within a range of 0.6<x<1.

The re-grown GaN layer 310 may be formed by etching a part of the $Si_xC_{1-x}$ layer 210 and growing GaN from an etched area of the $Si_xC_{1-x}$ layer 210. The re-grown GaN layer may grow from an inside of the $Si_xC_{1-x}$ layer 210 up to a surface of the $Si_xC_{1-x}$ layer 210.

Here, the re-grown GaN layer 310 may be a p-GaN layer 310 doped with p-type impurities. The p-type impurities may include magnesium (Mg), zinc (Zn), beryllium (Be), or the like. A doping concentration of the p-type impurities of the re-grown GaN layer 310 may be about $1.0 \times 10^{16}/cm^3$ to about $1.0 \times 10^{20}/cm^3$. The re-grown GaN layer 310 doped with the p-type impurities may contact a first electrode 400 that will be described below. The re-grown GaN layer 310 may reduce a leakage current.

The substrate 110 shown in FIG. 1 may be an n-type SiC substrate doped with n-type impurities. The $Si_xC_{1-x}$ layer 210 may also be an n-type $Si_xC_{1-x}$ layer doped with n-type impurities. In the n-type $Si_xC_{1-x}$ layer 210, a doping concentration of the n-type impurities may be about $1.0 \times 10^{16}/cm^3$ to about $1.0 \times 10^{20}/cm^3$. The n-type impurities may include Si, germanium (Ge), selenium (Se), tellurium (Te), C, or the like.

When the re-grown GaN layer 310 is doped with p-type impurities, a p-n junction is formed along the re-grown GaN layer 310, and a depletion layer is formed near a p-n junction interface during formation of the p-n junction. Accordingly, a high withstand voltage may be achieved. Free electrons and holes may diffuse toward each other at the p-n junction interface during formation of the p-n junction. Accordingly, a local potential difference may be generated, thereby bringing about a balanced state. The depletion layer without carriers may be formed due to the balanced state. As a result, the withstand voltage may be increased.

The depletion layer may reduce or prevent a leakage current generated at a Schottky junction area from leaking toward the first electrode 400. The depletion layer may be formed along the p-GaN layer 310 when an inverse voltage is applied. Accordingly, the leakage current leaking toward the first electrode 400 may be reduced.

Furthermore, the p-GaN layer 310 may grow from the etched area of the $Si_xC_{1-x}$ layer 210. Accordingly, damage of a crystal may be reduced or prevented, and reliability may be secured. Also, a dedicated ion implantation device may be unnecessary. Accordingly, the manufacturing process may be simplified and costs may be reduced.

An insulating layer 600 may be disposed in an area including the p-GaN layer 310 on the $Si_xC_{1-x}$ layer 210. The insulating layer is not formed in an area where the first electrode 400 is located.

The first electrode 400 (as a Schottky contact) may be disposed on the $Si_xC_{1-x}$ layer 210. The first electrode 400 may have a high Schottky barrier. Height of the Schottky barrier refers to a difference in a work function, which may determine characteristics of the SBD. As the difference in the work function is greater, a forward voltage of the SBD is increased, whereas the leakage current resistance is reduced when an inverse voltage is applied.

Therefore, the leakage current of the first electrode 400 may be reduced by forming a high Schottky barrier. The first electrode 400 may be made of a material selected from nickel (Ni), gold (Au), copper indium oxide ($CuInO_2$), indium tin oxide (ITO), platinum (Pt), and alloys of the foregoing materials. The alloy may include an alloy of Ni and Au, an alloy of $CuInO_2$ and Au, an alloy of ITO and Au, an alloy of Ni, Pt, and Au, or an alloy of Pt and Au, as examples.

A second electrode 500 may be an ohmic electrode disposed on another surface of the substrate 110, opposite to the surface on which the $Si_xC_{1-x}$ layer 210 is disposed. The second electrode 500 may have a low Schottky barrier and therefore may facilitate a flow of forward current. The second electrode 500 may be made of a material selected from chromium (Cr), aluminum (Al), tantalum (Ta), thallium (Tl), and gold (Au).

Referring to FIG. 2 in which the power device is illustrated as a FET, the substrate 120 may be a p-type SiC substrate doped with p-type impurities.

The $Si_xC_{1-x}$ layer 220 may be disposed on one surface of the substrate 120. In the $Si_xC_{1-x}$ layer 220, Si and C may be mixed or may be present at a predetermined ratio, and the predetermined ratio may be adjusted as desired. The $Si_xC_{1-x}$ layer 220 may facilitate a flow of current. A value x of the $Si_xC_{1-x}$ layer 220 may be within a range of 0<x<1. According to an exemplary embodiment, the value x may be within a range of 0.6<x<1.

The re-grown GaN layer 320 may be formed by etching a part of the $Si_xC_{1-x}$ layer 220 and growing GaN from an etched area of the $Si_xC_{1-x}$ layer 220. For example, the re-grown GaN layer may grow from an inside of the $Si_xC_{1-x}$ layer 220 up to a surface of the $Si_xC_{1-x}$ layer 220.

Here, the re-grown GaN layer 320 may be an n-GaN layer 320 doped with n-type impurities. The n-type impurities may include Si, Ge, Se, Te, C, or the like. The re-grown GaN layer 320 doped with n-type impurities may reduce ohmic resistance through contact with a source electrode 710 and a drain electrode 720, consequently increasing a current density.

The substrate 120 of FIG. 2 may be a p-type SiC substrate doped with p-type impurities. The $Si_xC_{1-x}$ layer 220 may also be a p-type $Si_xC_{1-x}$ layer doped with p-type impurities. The p-type impurities may include Mg, Zn, Be, or the like.

When the re-grown GaN layer 320 is doped with n-type impurities, a p-n junction is formed along the n-GaN layer 320. A depletion layer may be formed near a p-n junction interface during formation of the p-n junction. Accordingly, a high withstand voltage may be achieved. The depletion layer may reduce or prevent a leakage current.

A gate insulating layer 800 may be formed corresponding to a position of a gate electrode 730. The gate insulating layer 800 may be made of a material selected from silicon dioxide (SiO$_2$), silicon nitride (SiN$_x$), aluminum oxide (Al$_2$O$_3$), hafnium oxide (HfO$_2$), and gallium oxide (Ga$_2$O$_3$).

Hereinafter, a manufacturing method of a SBD shown in FIG. 1 will be described. FIGS. 3A to 3D illustrate a process of manufacturing the SBD shown in FIG. 1.

Referring to FIGS. 3A to 3D, the manufacturing method of the SBD may include forming the Si$_x$C$_{1-x}$ layer 210 on the surface of the substrate 110, and forming the re-grown GaN layer 310 by etching a part of the Si$_x$C$_{1-x}$ layer 210 and growing GaN from the etched area of the Si$_x$C$_{1-x}$ layer 210.

Figure 3A:
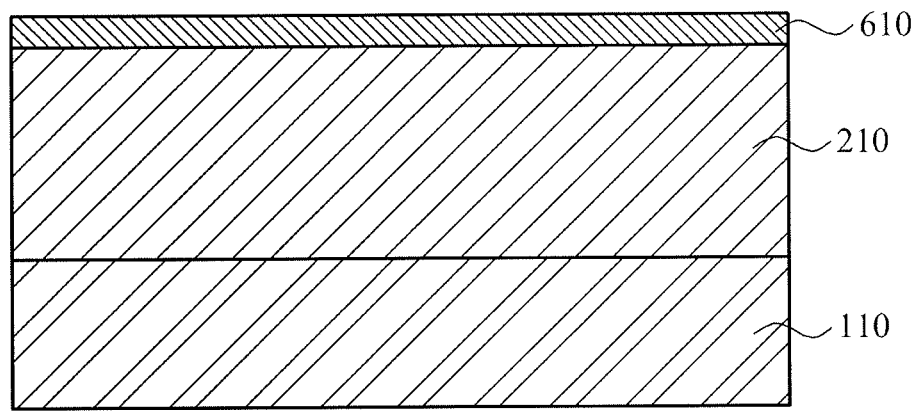
FIGS. 3A to 3D illustrate diagrams depicting stages of a process of manufacturing the power device shown in FIG. 1.

As shown in FIG. 3A, after the Si$_x$C$_{1-x}$ layer 210 is formed on the surface of the substrate 110, an insulating layer 610 may be formed on the Si$_x$C$_{1-x}$ layer 210 to be used as an etching mask for a photolithography process. The insulating layer 610 may be made of a material selected from SiN$_x$, silicon oxide (SiO$_x$), and Al$_2$O$_3$.

Figure 3B:
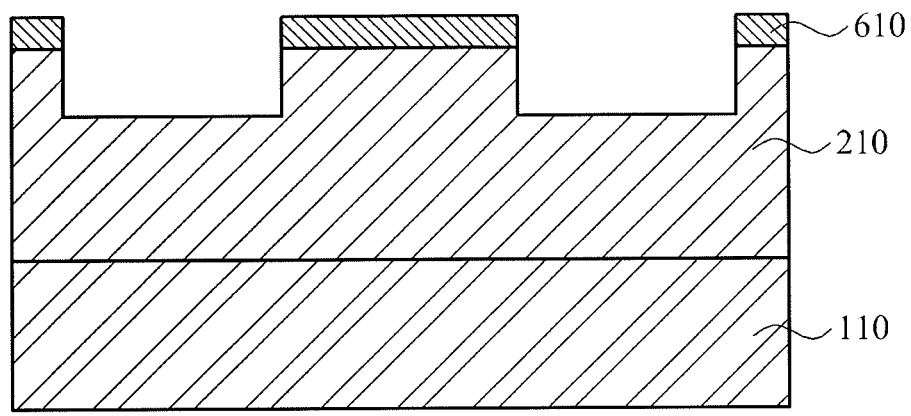

Referring to FIG. 3B, the insulating layer 610 is partially removed corresponding to positions to form the re-grown GaN layer 310, that is, the p-GaN layer 310. A part of the insulating layer 610 corresponding to a position of the p-GaN layer 310 is removed by an etching method such as dry etching, thereby exposing a part of the Si$_x$C$_{1-x}$ layer 210. Only a part of the exposed part of the Si$_x$C$_{1-x}$ layer 210 is etched.

Figure 3C:
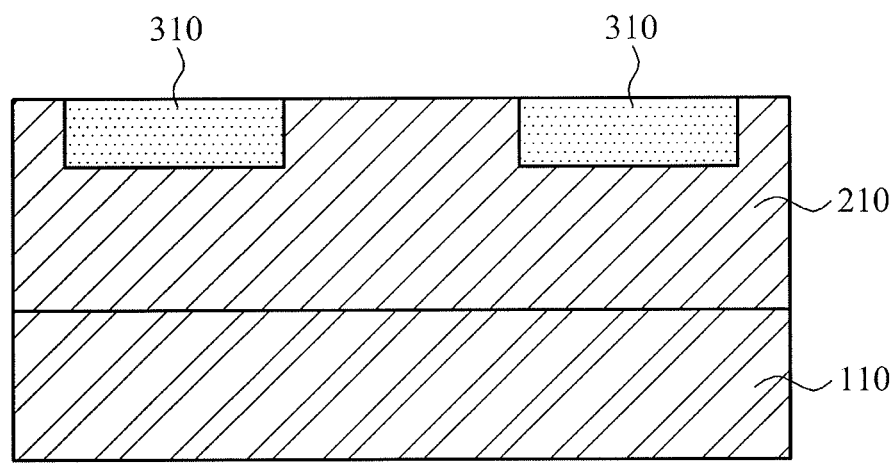

Referring to FIG. 3C, GaN is grown from the etched area of the Si$_x$C$_{1-x}$ layer 210, and the GaN is doped with p-type impurities, thereby forming the p-GaN layer 310. The p-GaN layer 310 may be formed by growing the GaN using a metal organic chemical vapor deposition (MOCVD) method.

The forming of the p-GaN layer 310, that is, the re-grown GaN layer 310, may be performed within a temperature range of about 1,000° C. to about 1,200° C. Thus, the p-GaN layer 310 may be formed under the high temperature. Accordingly, damage to a thin film crystal may be reduced or prevented, thereby securing reliability. Furthermore, ion implantation and heat treatment are not separately required. Accordingly, the manufacturing process may be simplified and costs may be reduced.

In addition, the p-n junction is formed along the p-GaN layer 310, and the depletion layer is formed near the p-n junction interface during the formation of the p-n junction. Therefore, a high withstand voltage may be achieved. The depletion layer may be formed along a p-GaN layer 310 when an inverse voltage is applied. Accordingly, the leakage current generated from a Schottky junction may be reduced or prevented from leaking toward the first electrode 400.

Figure 3D:
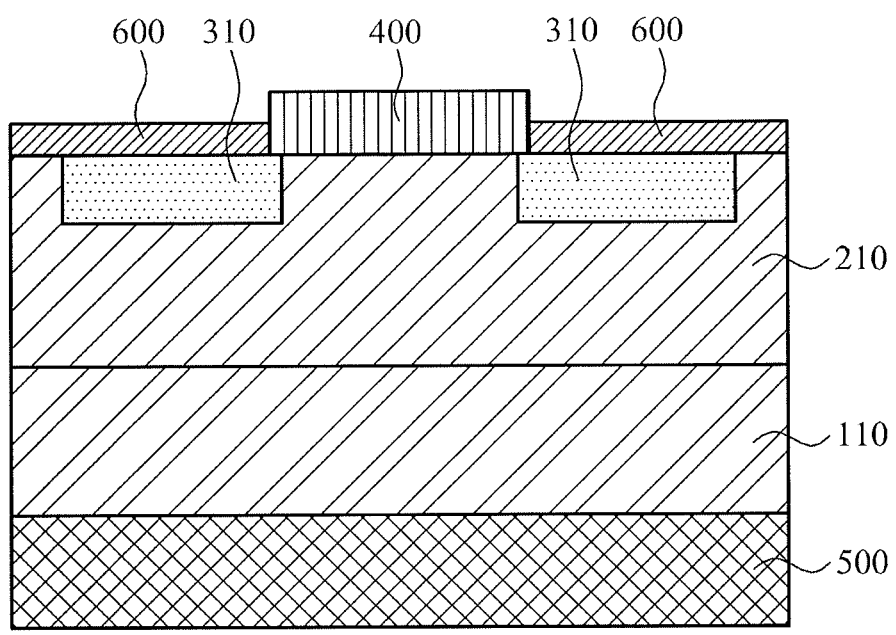

Referring to FIG. 3D, after the p-GaN layer 310 is formed, the first electrode 400 and insulating layer 600 are formed on the Si$_x$C$_{1-x}$ layer 210. The second electrode 500 is formed on another surface of the substrate 110. The first electrode 400 may be disposed to contact the p-GaN layer 310. The first electrode 310 may be made of a material selected from Ni, Au, CuInO$_2$, ITO, Pt, and an alloy of the foregoing materials. The alloy may include an alloy of Ni and Au, an alloy of CuInO$_2$ and Au, an alloy of ITO and Au, an alloy of Ni, Pt, and Au, or an alloy of Pt and Au, as examples. The second electrode 500 may be made of a material selected from Cr, Al, Ta, Tl, and Au.

It is to be understood that the FET depicted in FIG. 2 may be formed in a similar manner as described above, except for using a p-type substrate 120, forming a p-type Si$_x$C$_{1-x}$ layer 220, and forming an n-type re-grown GaN layer 320. In addition, a source electrode 710, drain electrode 720, gate insulation layer 800, and gate electrode 730 are formed.

By way of summation and review, nitride semiconductors are being actively researched throughout the world for application not only to optical devices but also to high-frequency high-power electronic devices. The nitride semiconductor may have excellent physical properties such as a large energy gap, high thermal stability, and high electron saturation velocity (~3×10$^7$ cm/sec). An electronic device using a nitride semiconductor may have various advantages such as a high breakdown electric field (~3×10$^6$ V/cm) and high maximum current density, stable high-temperature operation, and high conductivity.

A heterostructure field effect transistor (HFET) using a hetero junction structure of a compound semiconductor may have a large band-discontinuity at a junction interface. Therefore, high density electrons may be freed at the junction interface, thereby increasing electron mobility. Such a physical property enables the HFET to be applied as a high-power device.

A silicon carbide (SiC) device having a large band gap has generally been used as the power device. The SiC device may be mass-produced in a Schottky barrier diode (SBD) structure. However, in forming an SiC device, implantation equipment for injecting carriers in a p-type nitride semiconductor layer may be necessary, and heat treatment under a high temperature may be required for activation of the carriers.

In contrast, embodiments may provide a power device capable of reducing a leakage current and a manufacturing method for a power device that is simplified and has an increased reliability.

In the power device according to embodiments, a re-grown GaN layer is formed on a Si$_x$C$_{1-x}$ layer. Accordingly a depletion layer may be formed when an inverse current is applied. Consequently, the power device may reduce a leakage current.

The manufacturing method of the power device according to the embodiment forms a re-grown GaN layer by etching a part of a Si$_x$C$_{1-x}$ layer and growing a re-grown GaN layer from an etched area of the Si$_x$C$_{1-x}$ layer. Therefore, damage to a thin film crystal may be reduced or prevented, thereby securing reliability. Also, a dedicated ion implantation and heat treatment may be unnecessary. Accordingly, the manufacturing process may be simplified and costs may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. A power device, comprising:
   a substrate;
   a silicon carbide (Si$_x$C$_{1-x}$) layer on one surface of the substrate, wherein 0<x<1, the Si$_x$C$_{1-x}$ layer including an etched area, the etched area of the Si$_x$C$_{1-x}$ layer being in a form of a depression in the Si$_x$C$_{1-x}$ layer; and
   a re-grown gallium nitride (GaN) layer grown from the etched area of the Si$_x$C$_{1-x}$ layer such that the re-grown GaN layer fills the etched area of the Si$_x$C$_{1-x}$ layer and directly contacts a bottom and sides of the Si$_x$C$_{1-x}$ layer in the etched area.

2. The power device as claimed in claim 1, wherein:
   the substrate is an n-type SiC substrate, and
   the re-grown GaN layer is a p-GaN layer doped with p-type impurities.

3. The power device as claimed in claim 2, wherein the power device is a Schottky barrier diode (SBD) and further comprises:
a first electrode on the $Si_xC_{1-x}$ layer; and
a second electrode on another surface of the substrate, the other surface being opposite to the one surface on which the $Si_xC_{1-x}$ layer is located.

4. The power device as claimed in claim 3, wherein the $Si_xC_{1-x}$ layer is an n-type $Si_xC_{1-x}$ layer doped with n-type impurities.

5. The power device as claimed in claim 2, wherein a doping concentration of the p-type impurities of the p-GaN layer is about $1.0 \times 10^{16}/cm^3$ to about $1.0 \times 10^{20}/cm^3$.

6. The power device as claimed in claim 1, wherein:
the substrate is a p-type SiC layer, and
the re-grown GaN layer is an n-GaN layer doped with n-type impurities.

7. The power device as claimed in claim 6, wherein the power device is a field effect transistor (FET) and further comprises:
a gate electrode disposed on the $Si_xC_{1-x}$ layer; and
a source electrode and a drain electrode on the n-GaN layer.

8. The power device as claimed in claim 7, wherein the $Si_xC_{1-x}$ layer is a p-type $Si_xC_{1-x}$ layer doped with p-type impurities.

9. The power device as claimed in claim 6, wherein a doping concentration of the n-type impurities of the n-GaN layer is about $1.0 \times 10^{16}/cm^3$ to about $1.0 \times 10^{20}/cm^3$.

10. The power device as claimed in claim 1, wherein a top surface of the re-grown gallium nitride (GaN) layer is coplanar with a top surface of the $Si_xC_{1-x}$ layer.

11. A manufacturing method for a power device, the manufacturing method comprising:
forming a silicon carbide ($Si_xC_{1-x}$) layer on one surface of a substrate, wherein 0<x<1;
etching a part of the $Si_xC_{1-x}$ layer to provide an etched area, the etched area being in a form of a depression in the $Si_xC_{1-x}$ layer; and
growing gallium nitride (GaN) from the etched area of the $Si_xC_{1-x}$ layer to form a re-grown (GaN) layer, the re-grown GaN layer filling the etched area of the $Si_xC_{1-x}$ layer and directly contacting a bottom and sides of the etched area of the $Si_xC_{1-x}$ layer.

12. The manufacturing method as claimed in claim 11, wherein the growing of GaN from the etched area of the $Si_xC_{1-x}$ layer to form the re-grown GaN layer is performed within a temperature range of about 1,000° C. to about 1,200° C.

13. The manufacturing method as claimed in claim 11, wherein:
the substrate is an n-type SiC substrate, and
the re-grown GaN layer is a p-GaN layer doped with p-type impurities.

14. The manufacturing method as claimed in claim 13, further comprising:
forming a first electrode on the re-grown GaN layer and the $Si_xC_{1-x}$ layer such that the first electrode is in contact with the re-grown GaN layer; and
forming a second electrode on another surface of the substrate, the other surface being opposite to the one surface on which the $Si_xC_{1-x}$ layer is disposed.

15. The manufacturing method as claimed in claim 14, wherein the $Si_xC_{1-x}$ layer is an n-type $Si_xC_{1-x}$ layer doped with n-type impurities.

16. The manufacturing method as claimed in claim 11, wherein
the substrate is a p-type SiC substrate, and
the re-grown GaN layer is an n-GaN layer doped with n-type impurities.

17. The manufacturing method as claimed in claim 16, further comprising:
forming a gate electrode on the $Si_xC_{1-x}$ layer; and
forming a source electrode and a drain electrode on the n-GaN layer.

18. The manufacturing method as claimed in claim 17, wherein the $Si_xC_{1-x}$ layer is a p-type $Si_xC_{1-x}$ layer doped with p-type impurities.

* * * * *